United States Patent
Yao et al.

[11] Patent Number: 6,153,541
[45] Date of Patent: Nov. 28, 2000

[54] METHOD FOR FABRICATING AN OXYNITRIDE LAYER HAVING ANTI-REFLECTIVE PROPERTIES AND LOW LEAKAGE CURRENT

[75] Inventors: Liang-Gi Yao, Taipei; Yue-Feng Cheu, Hsinchu; Keng-Chu Lin, Ping-Tung, all of Taiwan

[73] Assignee: Vanguard International Semiconductor Corporation, Hsin-Chu, Taiwan

[21] Appl. No.: 09/256,269

[22] Filed: Feb. 23, 1999

[51] Int. Cl.[7] .................................................. H01L 21/316
[52] U.S. Cl. .............................................................. 438/786
[58] Field of Search ..................................... 438/786, 952, 438/FOR 395, FOR 401; 430/317; 427/99

[56] References Cited

U.S. PATENT DOCUMENTS

| | | |
|---|---|---|
| 4,717,631 | 1/1988 | Kaganiwicz et al. . |
| 5,164,339 | 11/1992 | Gimpelson . |
| 5,260,236 | 11/1993 | Petro et al. . |
| 5,365,104 | 11/1994 | Godinho et al. . |
| 5,639,687 | 6/1997 | Roman et al. . |
| 5,904,566 | 5/1999 | Tao et al. . |

OTHER PUBLICATIONS

S. Wolf, "Silicon Processing for the VLSI Era", Lattice Press, vol. I, p. 195, 1990.

Primary Examiner—George Fourson
Assistant Examiner—Joannie A. Garcia
Attorney, Agent, or Firm—George O. Saile; Stephen B. Ackerman; William J. Stoffel

[57] ABSTRACT

A method for fabricating an anti-reflective coating (ARC) with a leakage current of less than 1.0 pA/cm$^2$ at a voltage of about 10 V. The ARC is formed by depositing a silicon oxynitride film over a semiconductor substrate using a plasma enhanced chemical vapor deposition process. To obtain a silicon oxynitride layer having n and k values appropriate for use as an Anti-Reflection Coating (ARC) and having leakage current appropriate for use as an etch-stop or CMP-stop and dielectric layer in a subsequently formed device, it is crucial to have a SiH$_4$ to N$_2$O ratio less than 2.5 and an RF power greater than 120 W.

7 Claims, 2 Drawing Sheets

METHOD FOR FABRICATING AN OXYNITRIDE LAYER HAVING ANTI-REFLECTIVE PROPERTIES AND LOW LEAKAGE CURRENT

BACKGROUND OF INVENTION

1) Field of the Invention

This invention relates generally to fabrication of semiconductor devices and more particularly to the fabrication of an oxynitride layer for use as an anti-reflective coating (ARC) or as a stop layer having low leakage current.

2) Description of the Prior Art

The semiconductor industry's continuing drive toward integrated circuits with ever decreasing geometries, coupled with its pervasive use of highly reflective materials, such as polysilicon, aluminum and metal silicides, has led to increased photolithographic patterning problems. Unwanted reflections from these underlying materials during the photoresist patterning process cause the resulting photoresist pattern to be distorted. The use of an anti-reflective coating (ARC) has become popular in the semiconductor industry to prevent distortion of photoresist patterns. An Anti-Reflection Coating (ARC) is a layer of electiomagnetic energy absorbing material formed subjacent to a photoresist layer to minimize pattern distortion caused by reflection. Oxynitride can be used to form anti-reflective coatings.

Importantly, the inventors have found that to increase manufacturing efficiency, it would be advantageous in the semiconductor industry to use an ARC as a dielectric in subsequently defined semiconductor devices. However, the inventor's have found that oxynitride ARCs exhibit leakage currents that prevent their use as a dielectric in a semiconductor device.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,639,687 (Roman et al.) discloses a process of making a Si-rich silicon oxynitride layer.

U.S. Pat. No. 5,365,104 (Godinho et al.) shows a SiON process for making a silicon oxynitride passivation layer.

U.S. Pat. No. 4,717,631 (Kaganowicz et al.) shows a method for making SiON having a specific low Hydrogen % range.

SUMMARY OF THE INVENTION

It is an object of the present invention to provide a method for fabricating a silicon oxynitride layer that can be used as an anti-reflective coating and remain over a conductive layer as a dielectric layer.

It is another object of the present invention to reduce the high temperature current leakage of a silicon oxynitride ARC while maintaining suitable absorptive properties.

It is another object of the present invention to provide a dielectric film which can act as an etch stop layer or as a CMP stop layer.

It is yet another object of the present invention to provide an economical method for fabricating semiconductor devices which minimizes distortion of photolithographic patterns.

To accomplish the above objectives, the present invention provides a method for fabricating a silicon oxynitride layer that is an anti-reflective coating and also a dielectric layer. The ARC is formed by depositing a silicon oxynitride film over a semiconductor substrate using a plasma enhanced chemical vapor deposition process. The invention provides a silicon oxynitride layer having n and k values appropriate for use as an Anti-Reflection Coating (ARC) and having leakage current appropriate for use as an etch-stop or CMP-stop and dielectric layer in a subsequently formed device. To obtain these results, it is crucial to have a $SiH_4$ to $N_2O$ ratio less than 1.2 and an RF power greater than 120 W.

The present invention provides considerable improvement over the prior art. A major component of the invention is the realization that SiON ARC layer used as dielectric layers contribute leakage currents to devices. These leakage currents make the newer more leakage sensitive devices fail. In the prior art the index of refraction (n) and index of absorption (k) are maximized during formation of silicon oxynitride ARC. While this approach significantly reduces distortion caused by reflection, the resulting ARC may exhibit high leakage. The high leakage prevents the silicon oxynitride ARC from being useful as a dielectric layer. The inventors believe that this high leakage is caused by hydrogen-related and silicon-rich bondings.

The bondings in the silicon oxynitride ARC could be measured by Fourrier transformation infra-red measurement (FTIR) and optical measurement as are known in the art. The n and k values for the silicon oxynitride ARC provide a good indication of its bonding. In this invention a $SiH_4/N_2O$ ratio of less than 1.2 and RE power greater than 120 W are crucial to obtain a silicon oxynitride layer with n and k values suitable for an ARC with a leakage current suitable for a dielectric layer in a subsequent device. The inventors have experimentally obtained n values in the range between 2.15 and 2.0 and k values in the range between 0.6 and 0.3 at a wavelength of about 248 nm, and n values in the range between 1.95 and 1.80 and k values in the range between 0.8 and 0.5 at a wavelength of about 200 nm, while maintaining leakage current values of less than 1.0 $pA/cm^2$ at a voltage of about 5 Volts.

These properties allow the silicon oxynitride ARC of the present invention to be used as an etch-stop or CMP-stop layer during device fabrication. For example, it could act as an etch-stop layer to evacuate oxide material for increasing the outer surface of a crown capacitor in a DRAM device.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for fabricating a silicon oxynitride layer that is an anti-reflective coating and also a dielectric layer. The silicon oxynitride layer can also act as an etch-stop or CMP-stop layer.

Figure 1:
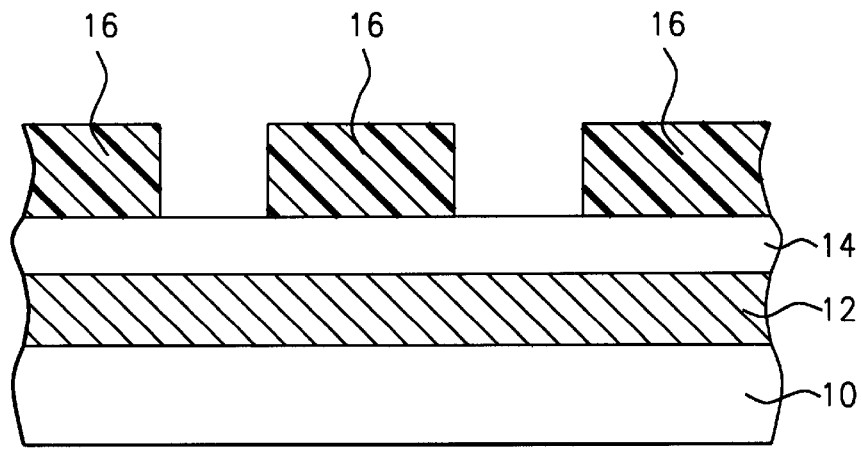
FIG. 1 illustrates a cross-sectional view of a process for fabrication of an oxynitride layer that can be used as an anti-reflective coating and as a dilectric layer in a subsequently formed semiconductor device.

Referring to FIG. 1, the process begins by providing a semiconductor structure 10. The semiconductor structure can be comprised of silicon and can have one or more layers thereon. For example, the semiconductor structure can have thereon STI's, an insulation layer or even a device layer. In one embodiment, a conductive layer 12 is formed over the semiconductor substrate 10. The conductive layer 12 can be comprised of polycrystalline silicon, a metal such as aluminum or tungsten, or a metal silicide such as titanium suicide.

Still referring to FIG. 1, a silicon oxynitride layer 14 is formed over said conductive layer. The silicon oxynitride layer 14 preferably is formed by plasma enhanced chemical vapor deposition (PECVD) in a plasma reactor under the following conditions:

TABLE 1

| | flow rates (sccm) | | time | press. | temp. | RF power |
|---|---|---|---|---|---|---|
| | SiH$_4$ | N$_2$O | He | (sec) | (torr) | (° C.) | (W) |
| MIN | 30 | 50 | 1500 | 5 | 3 | 300 | 120 |
| TGT | 40 | 90 | 1900 | 20 | 5 | 400 | 150 |
| MAX | 60 | 130 | 2500 | 60 | 8 | 450 | 200 |

The flow rates above can be scaled up or down keeping the same molar ratios to accommodate any size plasma reactor. The Silicon oxynitride layer 14 preferably has a thickness of between about 150 and 600 Å.

The present inventors have experimentally determined that by maintaining a SiH$_4$ to N$_2$O flow rate ratio in the range between 0.25 and 1.2 and by maintaining an RF power in the range between 120W and 200 W during the silicon oxynitride layer formation, the resulting ARC not only prevents pattern distortion, but also provides unexpectedly good dielectric properties. The invention's Silicon oxynitride layer 14 has a leakage of less than 1 pA (picoamp) when measured at a voltage of 5V and a temperature between 25° C. and 150° C.

Referring again to FIG. 1, a photoresist layer 16 is formed over the silicon oxynitride layer 14. A photoresist mask 16A is formed by exposing select portions of the photoresist layer 16 to light or electromagnetic radiation having a wavelength in the range between about 150 nm and 250 nm, then removing the unexposed portions of the photoresist. During the exposure, the oxynitride layer prevents pattern distortion by absorbing the light or electromagnetic radiation that would otherwise be reflected back into the photoresist.

Figure 2:
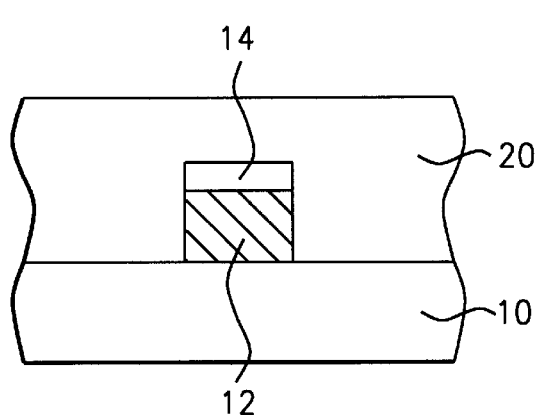
FIG. 2 illustrates a cross-sectional view of a device fabricated using the present invention.

Referring to FIG. 2, the silicon oxynitride layer 14 and conductive layer 12 are etched through the photoresist mask 16 as is well known in the art to define conductive patterns such as lines or gates for a semiconductor device. The conductive layer 12 can be metal, polysilicon, or a stacked film. The remaining portions of the silicon oxynitride layer 14 can be used as a dielectric layer. After etching, insulating or conductive layers 20 can be formed over the SiON layer. The SiON layer remains in the device and has a low leakage current.

Figure 3:
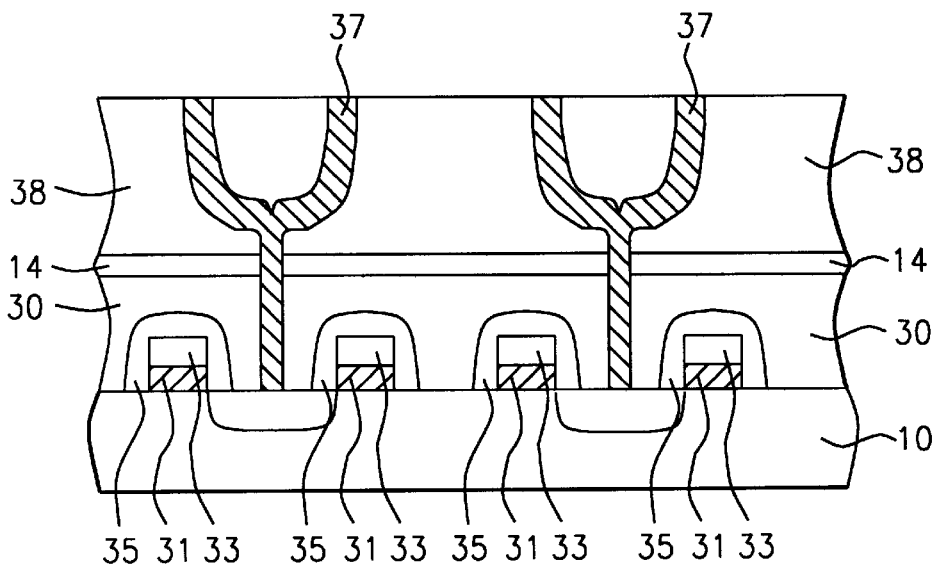
FIG. 3 illustrates a cross-sectional view of a capacitor fabricated using a SiON layer fabricated according to the present invention.

FIG. 3 shows the invention's silicon oxynitride layer implemented in a capacitor device. In this application the silicon oxynitride layer formed by the present invention acts as an etch stop in a damascene structure. Gates 31 are formed on a semiconductor structure 10. Hard mask layer 33 can be the invention's ARC SiON layer. Layer 35 is a dielectric layer. An interlayer dielectric (ILD) 30 is formed over the gates. A SiON layer 14 is formed on the ILD according to the present invention. A second dielectric layer 38 is formed over the SiON layer 14. The SiON layer 14 is used as an etch-stop during fabrication of a capacitor 37 over the gates 31.

Figure 4:
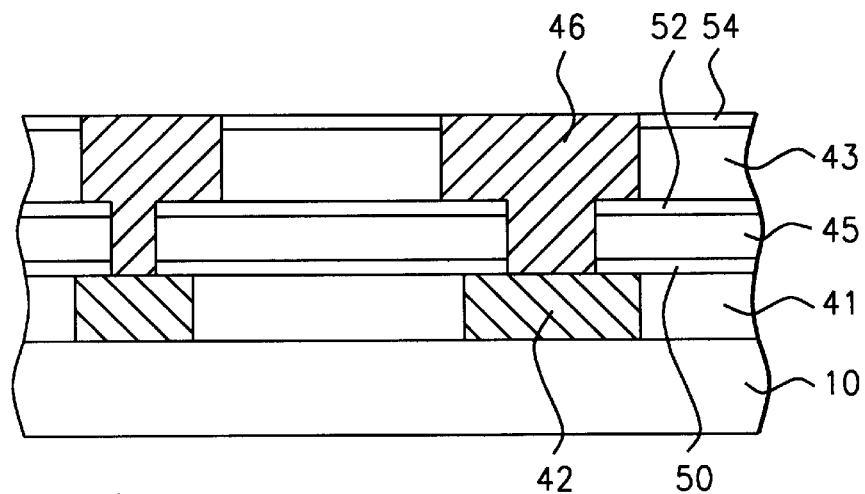
FIG. 4 illustrates a cross-sectional view of a dual damascene structure using a SiON layer fabricated according to the present invention.

FIG. 4 shows a SiON layer 50 52 54 fabricated according to the present invention used in a dual damascene device. A first metal pattern 42 and a first dielectric layer 41 are formed over a semiconductor structure 10. A first SiON layer 50 is fabricated according to the present invention over the first metal pattern 42 and the first dielectric layer 41 to act as an anti-reflective etch stop. A second dielectric layer 45 is formed on the first SiON layer 50. A second SiON layer 52, a third dielectric layer 45, and a third SiON layer 54 are formed thereover. The layers are patterned to form a dual damascene opening. A conductive plug 46 is formed within the opening. Various photo and etching processes can be used and are well know in the art.

The invention's SION layer can be implemented on conductive layers, on oxide or other dielectric layers, as a BARC, on damascene or dual damascene structures, as a CMP or etch stop layer. It is important to understand that the invention's SION layer remains in the semiconductor devices and is not removed.

EXAMPLES

Figure 5A:
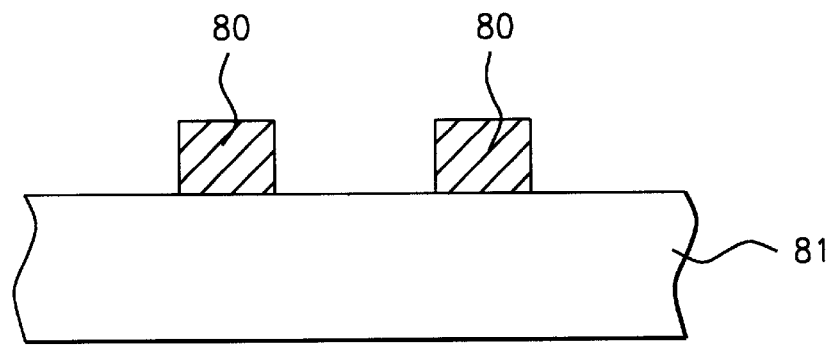
FIGS. 5A and 5B illustrate the test set-up used to measure leakage of a SiON layer fabricated according to the invented process.
Figure 5B:
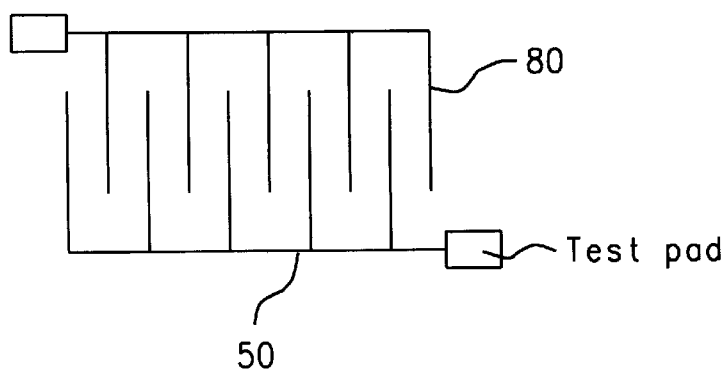

The inventors have found that the Invention's SiON layer has a lower leakage current (or IV curve) that conventional SiON layers. As shown in FIGS. 5A and 5B, the inventors formed conductive lines 80 various SiON layer 81 formed using various deposition process as shown in table 2 below. FIG. 5A shows a cross sectional view. FIG. 5B shows a top down of the test pattern. IV curves were plotted for various SiON layers. The invention's SiON process produced unexpectedly low leakage current as shown in table 2. All the invention process had leakage less than 1 pA.

TABLE 2

| flow rates (sccm) | | | Power | Temp (° C.) | Leakage (at 5 V) |
|---|---|---|---|---|---|
| SiH$_4$ | N$_2$O | He | | | |
| 80 | 60 | 1900 | 120 W | 25 | 5 pA |
| 80 | 60 | 1900 | 120 W | 150 | 1.9 nA |
| 40 | 90 | 1900 | 120 W | 25 | <1 pA |
| 40 | 90 | 1900 | 120 W | 150 | <1 pA |
| 40 | 90 | 1900 | 200 W | 25 | <1 pA |
| 40 | 90 | 1900 | 200 W | 150 | <1 pA |
| 60 | 130 | 1900 | 120 W | 25 | <1 pA |
| 60 | 130 | 1900 | 120 W | 150 | <1 pA |
| 30 | 110 | 1900 | 120 W | 25 | <1 pA |
| 30 | 110 | 1900 | 120 W | 150 | <1 pA |

While the invention has been particularly shown and described with reference to the preferred embodiments thereof, it will be understood by those skilled in the art that various changes in form and details may be made without departing from the spirit and scope of the invention.

What is claimed is:

1. A method for fabricating an anti-reflective SiON layer comprising depositing a silicon oxynitride film over a semiconductor structure using a plasma enhanced chemical vapor deposition process using a combination of source gasses consisting of a hydrogen-free carrier gas, $SiH_4$ and $N_2O$, wherein the ratio of the flow rate of $SiH_4$ to $N_2O$ is in the range between about 0.25 and 1.2 and applying an RE power in the range between about 120 W and 200 W; whereby said anti-reflective SiON laer has a leakage current of less than 5 $pA/cm^2$ at a potential of 5 volts and an index of absorption of less than 0.8 at a wavelength in the range between about 200 nm and 248 nm.

2. The method of claim 1 wherein said hydrogen-free carrier gas is He; and wherein the flow rate of $SiH_4$ is in the range between about 30 sccm and 60 sccm; the flow rate of $N_2O$ is in the range between about 50 sccm and 130 sccm, the flow rate of He is in the range between about 1500 sccm and 2500 sccm; the pressure is in the range between about 3 torr and 8 torr; the Rf power is in the range between 120 W and 199 W; and the temperature is in the range between about 300° C. and 450° C.

3. The method of claim 1 wherein the thickness of said silicon oxynitride film is in the range between about 150 Å and 600 Å; said silicon oxynitride film having a refractive index (n) in the range between about 2.0 and 2.15; and an absorptive index (k) in the range between about 0.3 and 0.6 at a wavelength of about 248 nm, and a refractive index (n) in the range between about 1.80 and 1.95; and an absorptive index (k) in the range between about 0.5 and 0.8 at a wavelength of about 200 nm.

4. The method of claim 1 which further includes using said SiON layer as an etch stop layer.

5. A method for fabricating a silicon oxynitride layer that is an anti-reflective coating and also a low leakage current dielectric layer, comprising the steps of:

a) providing a semiconductor structure;

b) forming a conductive layer over said semiconductor structure;

c) forming a silicon oxynitride layer over said conductive layer; using a plasma enhanced chemical vapor deposition in an ambient consisting of He, $SiH_4$ and $N_2O$ and having a ratio of $SiH_4$ to $N_2O$ in the range between about 0.25 and 1.2; with an RF power in the range between 120W and 200W; said silicon oxynitride layer having a leakage current of less than 5 pA at a potential of 5V and an index of absorption less than 0.8 at a electromagnetic radiation wavelength of between about 150 nm and 250 nm;

d) forming a photoresist layer over said silicon oxynitride layer;

e) exposing portions of said photoresist layer to electromagnetic radiation having the exposure wavelength in the range between 150 nm and 250 nm to form a photoresist pattern, wherein said silicon oxynitride layer is an anti-reflective coating; and f) removing potions of said silicon oxynitride to define semiconductor devices wherein the remaining portion of said silicon oxynitride layer is a dielectric layer.

6. The method of claim 5 wherein the thickness of said silicon oxynitride film is in the range between about 150 Å and 600 Å; said silicon oxynitride film having a refractive index (n) in the range between about 2.0 and 2.15; and an absorptive index (k) in the range between about 0.3 and 0.6 at a wavelength of about 248 nm, and a refractive index (n) in the range between about 1.80 and 1.95; and an absorptive index (k) in the range between about 0.5 and 0.8 at a wavelength of about 200 nm measured at a temperature between about 25° C. and 125° C.

7. The method of claim 5 which further includes, following step f): forming a dielectric layer over said silicon oxynitride layer; and patterning said dielectric layer using said silicon oxynitride layer as an etch stop layer.

* * * * *